United States Patent
Aggarwal et al.

(10) Patent No.: US 6,274,388 B1
(45) Date of Patent: Aug. 14, 2001

(54) ANNEALING OF A CRYSTALLINE PEROVSKITE FERROELECTRIC CELL

(75) Inventors: Sanjeev Aggarwal; Anil M. Dhote, both of College Park; Ramamoorthy Ramesh, Burtonsville, all of MD (US)

(73) Assignees: Telcordia Technologies, Inc., Morristown, NJ (US); University of Maryland at College Park, College Park, MD (US)

( * ) Notice: Subject to any disclaimer, the term of this patent is extended or adjusted under 35 U.S.C. 154(b) by 0 days.

(21) Appl. No.: 09/197,157

(22) Filed: Nov. 20, 1998

Related U.S. Application Data

(62) Division of application No. 08/871,057, filed on Jun. 9, 1997.

(51) Int. Cl.[7] .................................................. H01L 21/00
(52) U.S. Cl. .......................... 438/3; 438/240; 438/253; 438/396; 438/381; 257/295; 257/306; 257/310
(58) Field of Search ..................... 438/3, 240, 253, 438/238, 244, 329, 381, 396; 257/295, 306, 310

(56) References Cited

U.S. PATENT DOCUMENTS

| | | | |
|---|---|---|---|
| 5,358,889 | * 10/1994 | Emesh et al. ............................... | 438/3 |
| 5,449,933 | 9/1995 | Shindo et al. ......................... | 257/295 |
| 5,491,102 | 2/1996 | Desu et al. .............................. | 437/52 |
| 5,519,235 | 5/1996 | Ramesh .................................. | 257/295 |
| 5,625,233 | * 4/1997 | Cabral et al. .......................... | 257/771 |
| 5,650,362 | * 7/1997 | Nashimoto ........................ | 427/126.3 |
| 5,777,356 | * 7/1998 | Dhote et al. .......................... | 257/295 |
| 5,790,366 | 8/1998 | Desu et al. ............................. | 361/305 |

FOREIGN PATENT DOCUMENTS

| 4-80971 | 3/1992 | (JP) | ............................. H01L/29/788 |

OTHER PUBLICATIONS

"Ordered Intermetallics" *ASM Handbook, vol. 2, Properties and Selection: Nonferrous Alloys and Special–Purpose Materials* (ASM International, 1992) pp. 913–942.

* cited by examiner

*Primary Examiner*—Charles Bowers
*Assistant Examiner*—Hsien-Ming Lee
(74) *Attorney, Agent, or Firm*—David A. Hey

(57) ABSTRACT

A method of fabricating a ferroelectric capacitor usable as a memory cell in a non-volatile integrated circuit memory integrated on a silicon substrate, preferably including an intermetallic barrier layer. The memory cell consists of a ferroelectric layer, for example of lead niobium zirconium titanate (PNZT) sandwiched between metal oxide electrodes, for example of lanthanum strontium cobaltite (LSCO), which forms with a crystalline orientation and provides a growth template for the crystalline formation of the ferroelectric. The intermetallic layer prevents diffusion of oxygen from the bottom LSCO electrode down to the underlying silicon. At least the bottom electrode is subjected to a rapid thernal anneal at an annealing temperature above its growth temperature. Thereby, the polarization and fatigue characteristics of the ferroelectric cell are improved. Also, a similar intermetallic layer may be placed above the ferroelectric cell. A preferred composition of the intermetallic layer is a refractory silicide, especially a refractory disilicide.

20 Claims, 9 Drawing Sheets

ANNEALING OF A CRYSTALLINE PEROVSKITE FERROELECTRIC CELL

This application is a Div of Ser. No. 08/871,057 filed Jun. 9, 1997.

FIELD OF THE INVENTION

The invention generally relates to ferroelectric structures integrated onto substrates such as silicon. In particular, the invention relates to the fabrication process of producing a crystallographically oriented ferroelectric structure.

BACKGROUND ART

Considerable interest exists in fabricating integrated circuit (IC) memories which are non-volatile, that is, ones that continue to store data after the IC chip has been powered down. One type that is reaching the market is a ferroelectric memory in which the gap between the capacitors of an electrode is filled with a ferroelectric material which can be electrically poled into two stable states. The commercial activity to date has involved polycrystalline ferroelectric materials. Despite intensive developmental efforts, these polycrystalline ferroelectric IC memories exhibit poor fatigue characteristics and suffer from low yield in manufacture.

In an alternative approach under development, the ferroelectric material is grown in a crystallographically oriented phase. It is believed that under the proper conditions the ferroelectric grows in a columnar multicrystalline structure with the <001> axis of the layered perovskite crystal structure of typical ferroelectrics being preferentially oriented normal to the ferroelectnc film. Examples of the ferroelectric materials include lead zirconium titanate (PZT), lead lanthanum zirconium titanate (PLZT), lead niobium zirconium titanate (PNZT). Columnar crystallites are formed with random orientation within the plane of the film.

Dhote and Ramesh, two of the present inventors, have disclosed two distinct but related structures in U.S. patent applications, Ser. No. 08/578,499 filed Dec. 26, 1995 now issued as U.S. Pat. No. 5,798,903, and Ser. No. 08/582,545 filed Jan. 3, 1996 now issued as U.S. Pat. No. 5,777,356, both incorporated herein by reference in their entireties. The structure of the latter patent application is illustrated in the cross-sectional view of FIG. 1. An illustrated ferroelectric random access memory (FRAM) cell 20, of which many are formed in the IC memory, is formed on a <001>-oriented crystalline silicon substrate 22 and includes both a ferroelectric capacitor and a transistor. A metal-oxide-semiconductor (MOS) transistor is created by forming source and drain wells 24, 26 having a conductivity type opposite to that of the substrate 22. The intervening gate region is overlaid with a gate structure 28 including a lower gate oxide and an upper metal gate line, for example of aluminum, to control the gate.

A first inter-level dielectric layer 30 is deposited over the substrate and the transistor structure. A through hole 32 is etched through the first inter-level dielectric layer 30 in the area over the source well 24, and polysilicon is filled into the through hole 32 to form a polysilicon contact plug to the transistor source. A metal source line 34 is photolithographically delineated on top of the first inter-level dielectric layer 30 and electrically contacts the polysilicon plug.

A second inter-level dielectric layer 36 is then deposited over the first inter-level dielectric layer 30. Another through hole 38 is etched through both the first and second interlevel dielectric layers 30, 36 over the area of the drain well 26, and polysilicon is filled into the second through hole 38 to form a contact plug to the transistor drain.

A lower ferroelectric stack is then deposited and defined. It includes a polysilicon layer 40 to promote electrical contact to the polysilicon plug 38, a titanium nitride (TiN) layer 42 acting as a first conductive barrier between the underlying polysilicon and the oxidizing ferroelectric layer and its oxide electrodes, an intermetallic layer 44 acting as the primary barrier, and a lower metal-oxide electrode 46.

Growth of the metal-oxide electrodes 46, 52 and the ferroelectric layer 50 is performed at temperatures in the range of 500° to 650° C., the highest temperatures achieved in the processing after the deposition of the intermetallic layer 44.

The intermetallic layer 44 is novel to the second cited patent. It may have a composition of $Ti_3Al$, among other possibilities to be discussed later. In brief, an intermetallic is an alloy of at least two metals, one of which is refractory, and the metals are combined in stoichiometric or near stoichiometric ratios. There results a metal with long-range atomic order, that is, a metal that is at least polycrystalline. Liu et al. provide a good introduction to intermetallics, at least as used for mechanical components, in "Ordered Intermetallics," *ASM Handbook*, vol. 2, *Properties and Selection: Nonferrous Alloys and Special-Purpose Materials* (ASM International, 1992) pp. 913–942).

The lower metal-oxide electrode may have a composition of lanthanum strontium cobaltite (LSCO), which forms ia a perovskite crystal structure and in particular a composition of approximately $La_{1-x}Sr_xCoO_3$, where $0.15^3 x^3 0.85$. It is now well known that LSCO forms an acceptable electrical contact and further promotes highly oriented growth of perovskite ferroelectric materials. Several variations on the structure of the lower ferroelectric stack are possible. Neither the polysilicon layer 40 nor the TiN layer 42 is considered crucial, and either or both may be dispensed with.

A Z-shaped field-oxide layer 48 is formed around the sides of the lower ferroelectric stack and extends over its rim and laterally outwards from its bottom but leaves a central aperture for the after deposited upper ferroelectric stack.

The upper ferroelectric stack is then deposited and defined to fill the aperture of the field oxide layer 48 but not to extend beyond the end of its foot. The upper ferroelectric stack includes the ferroelectric layer 50, for example of PNZT, the upper metal-oxide electrode layer 52, for example of LSCO, and a platinum layer 54.

A third inter-layer dielectric layer 56 is deposited around the upper and lower ferroelectric stacks. A via hole 60 is etched down to the platinum layer 54, and Ti/W is filled into the hole to form a via 60 contacting the platinum layer 54. An aluminum layer is deposited and delineated to form an interconnect line 62 connected to the via 60.

Prototype ferroelectric capacitor stacks have been grown following the vertical stack structure shown in FIG. 1. Both the LSCO electrodes 46, 52 and the ferroelectric layer 50 have been shown to exhibit highly crystalline orientation. The ferroelectric stacks were measured to have polarization, fatigue, and retention properties superior to those available from polycrystalline ferroelectric cells.

Nonetheless, the results still need improvement. The cell manufactured according to the process exhibits a hysteresis curve adequate for operation at 5V. However, for high-level integration, 3V operation is greatly desired. The polarizability of the ferroelectric cell needs to be improved for 3V operation.

SUMMARY OF THE INVENTION

The invention can be summarized as a method of fabricating a perovskite layer over a metal-oxide layer. At least the metal-oxide layer is subjected to a rapid thermal anneal after its deposition.

A ferroelectric memory cell is formed over a silicon substrate with an intermediate intermetallic layer. A ferroelectric cell is formed by the sequential growth of a lower metaloxide electrode, a ferroelectric layer, and an upper metal-oxide layer. At least the lower metal-oxide electrode is annealed for a relatively short time at a temperature above the temperature at which it was grown.

In another aspect of the invention, the intermetallic layer is formed of a silicide, most preferably a disilicide of a refractory metal.

In yet another aspect of the invention, a second intermetallic layer is formed over the upper metal-oxide layer to provide electrical contacting to an upper metal level. The second intermetallic layer eliminates the need for platinum on the upper side. More preferably, the second intermetallic layer is formed of an intermetallic aluminide to provide a robust interface to an aluminum interconnect plug and aluminum wiring.

DETAILED DESCRIPTION OF THE PREFERRED EMBODIMENTS

Figure 1:
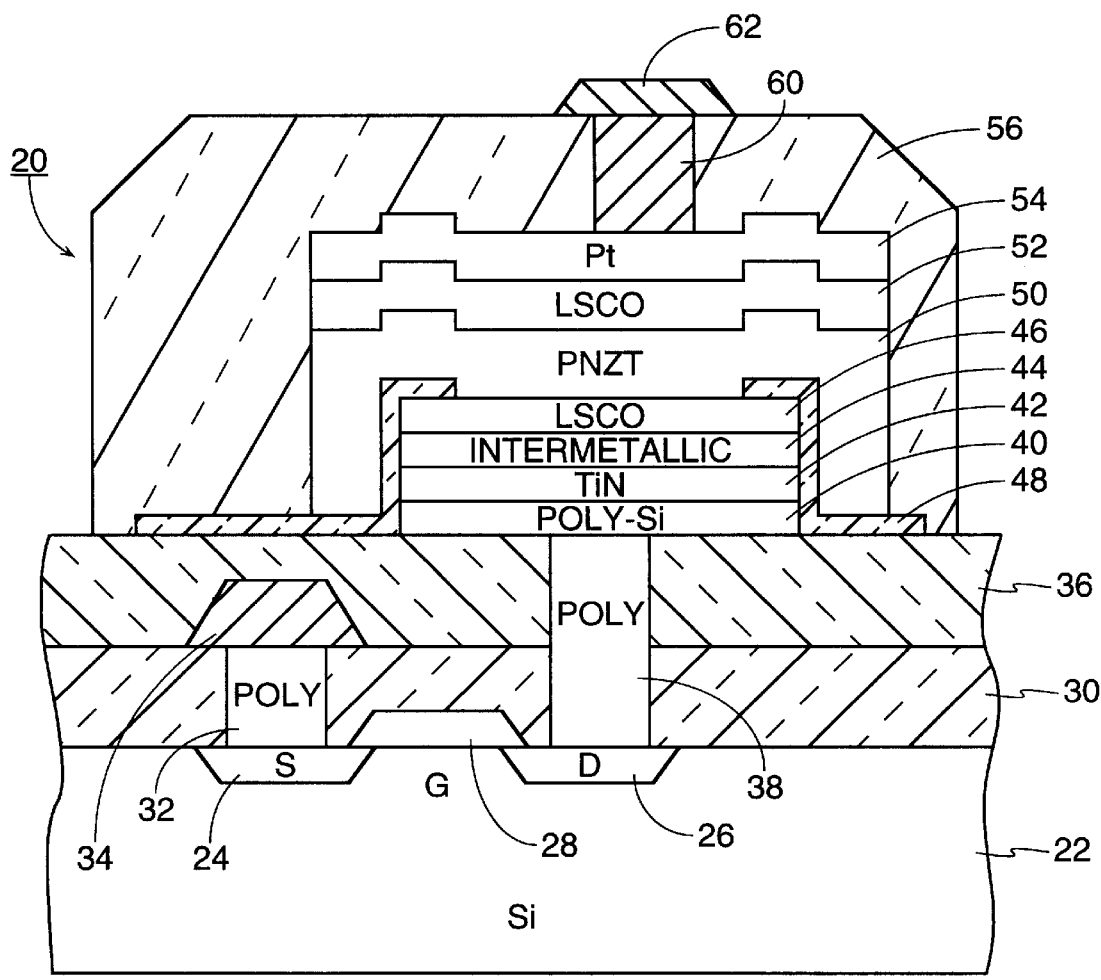
FIG. 1 is a cross-sectional view of a ferroelectric memory cell utilizing an intermetallic barrier.

In one embodiment of the invention, the structure of FIG. 1 is fabricated by much the same techniques as are described in the referenced patent application, as has been briefly described. As in the previously described growth of the lower ferroelectric stack, the lower metal-oxide electrode layer 46 is grown in the temperature range of 550 to 650° C. and cooled in an oxygen-rich environment However, thereafter, the substrate is removed from the growth chamber and is subjected to a rapid thermal anneal at a temperature above its growth temperature for a relatively short period of time. Following the anneal, the previously described processing is resumed, and the structure is completed. By means of the rapid thermal anneal, the polarization characteristics of the ferroelectric capacitor are improved while the fatigue and retention characteristics are at least maintained.

It is believed that the rapid thermal anneal causes the columnar crystallites in the lower metal-oxide layer 46 to enlarge to larger diameters. This lower metal-oxide layer 46 acts as a crystalline growth template for the growth of the overlying ferroelectric layer 50 with a highly oriented crystalline structure. Since the underlying metal-oxide template layer 46 has large crystallite sizes after the rapid thermal anneal, the after grown ferroelectric layer 50 also has larger crystallite sizes. Ferroelectric domains are known to have diameters of tens of nanometers. If the diameters of the columnar crystallites are several times this value, then each crystallite will contain several domains. That is, not all ferroelectric domains will extend across grain boundaries. Hence, grain boundaries and any subsequent diffusion along the grain boundaries will not affect all the ferroelectric domains, and the columnar ferroelectric layer will more resemble a singly crystalline layer.

A second effect is that the rapid thermal anneal will remove defects from the surface and the bulk of the lower metal-oxide layer 46 that would degrade the subsequent growth and would also affect the electrical characteristics of that interface. For example, in an oxygen-rich anneal, the perovskites can absorb more oxygen and reduce the concentration of oxygen vacancies. In some situations, the anneal amounts to a crystallization of a generally amorphous deposited layer.

A large number of experiments were performed on prototype structures to confirm the advantages of the invention. Unpatterned ferroelectric stacks were grown on either silicon wafers covered by a polysilicon layer or silicon wafers covered by polysilicon and then titanium nitride. The growths were performed by pulsed laser deposition (PLD) with a KrF excimer laser pulsed at 5 Hz at a fluence per pulse of $3J\times cm^{-2}$. The growths were performed with the substrate holder held at 600° C. The intermetallic layer 42 was deposited in a high vacuum while the metal-oxide and ferroelectric layers were deposited in an oxygen ambient of 100 mTorr. The metal-oxide layers 46, 52 had compositions of $La_{0.5}Sr_{0.5}CoO_3$ (LSCO) and thicknesses of 100 nm The ferroelectric layer 50 had a composition of $PbNb_{0.04}Zr_{0.28}Ti_{0.68}O_3$ (PNZT) and a thickness of 300 nm. Most of the samples included the top platinum layer 54.

Figure 2:
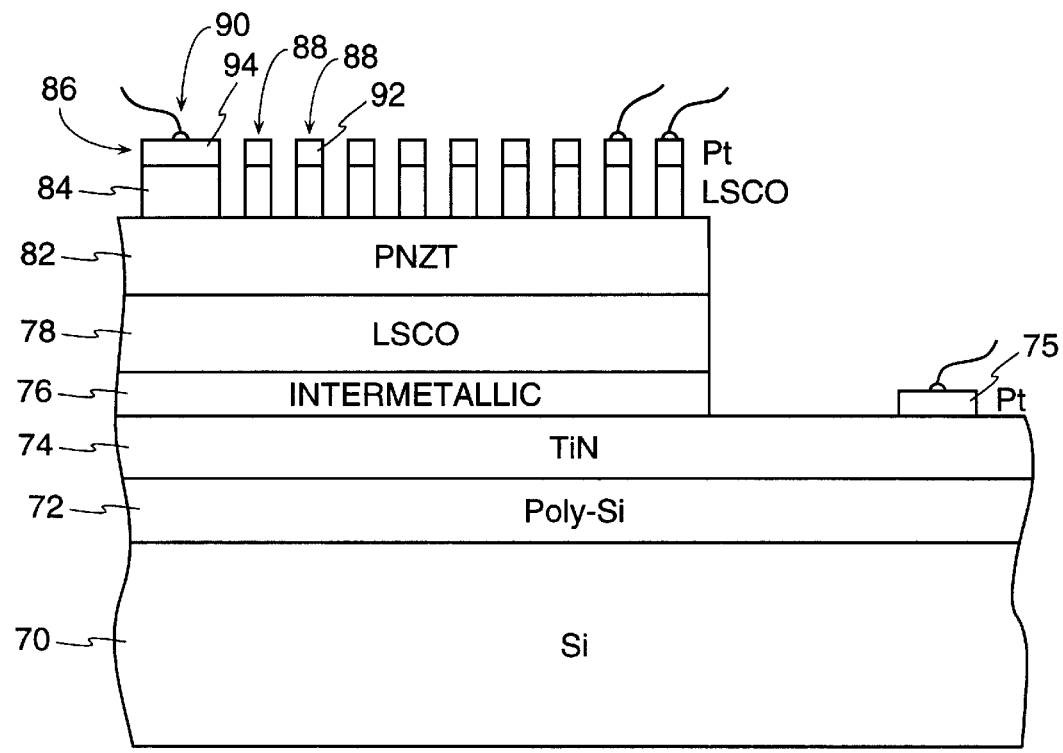
FIG. 2 is a cross-sectional view of a test stucture used as a prototype for the memory cell of FIG. 1.

Most electrical characterizations were performed upon a prototype capacitor structure shown in FIG. 2. A base structure includes a crystalline silicon substrate 70, a polysilicon layer 72, and a TiN layer 74. A platinum contact 75 is applied to an exposed area of the TiN layer 74. A lower ferroelectric stack includes an intermetallic layer 76, a lower metal-oxide electrode layer 78 of LSCO, and a ferroelectric layer 82 of PNZT. An upper metal-oxide electrode layer 84 is deposited over the ferroelectric layer 82 and formed into relatively small memory capacitors 88 and a much larger coupling capacitor 90. Platinum contacts 92, 94 are deposited on the memory and coupling capacitors 88, 90 prior to the capacitor definition and defined with them. The individual memory capacitors 88 are electrically accessed between their respective contacts 88 and either the coupling capacitor 90 at the top or the TiN contact 75 at the bottom. Details of the fabrication process are found in the latter referenced patent application to Dhote and Ramesh.

Experiment 1

Figure 3:
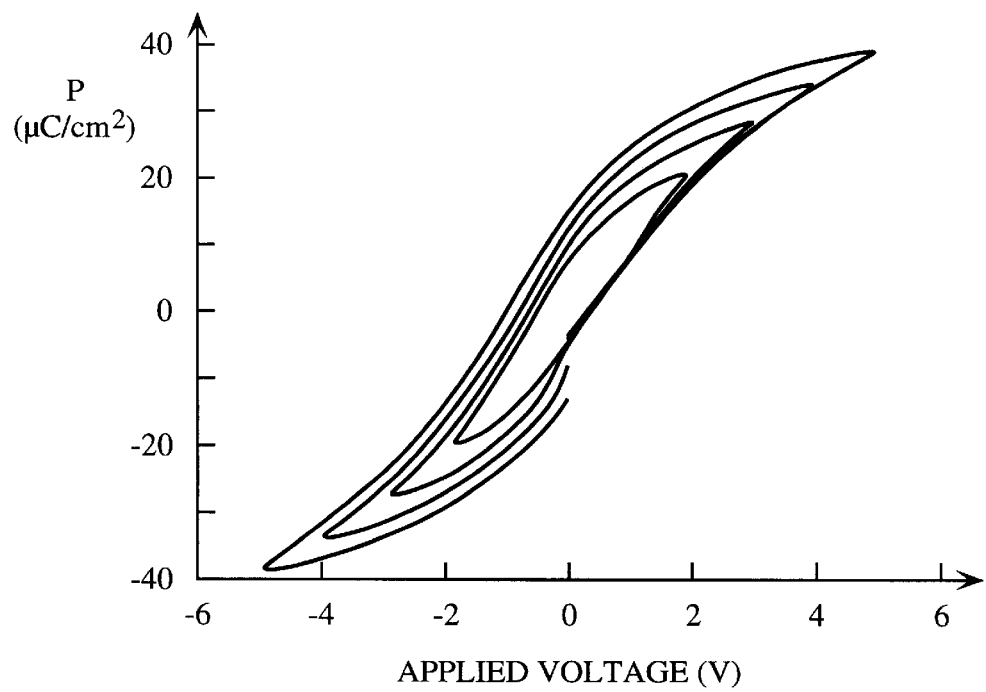
FIG. 3 is a graph showing a series of hysteresis curves for a ferroelectric capacitor of the invention.

A first test chip was fabricated with the intermetallic layer 76 being composed of $Ni_3Al$. All the laser ablated oxide layers were deposited at 600° C. After the deposition of the lower LSCO layer 78, the chip was removed from the laser deposition chamber and subjected to rapid thermal annealing at 750° C. for 120 s. The hysteresis loops for this chip, illustrated in the graph of FIG. 3, were measured at 100° C. The loops were measured for different values of maximum applied voltage, with the largest maximum voltages applied first. All the loops manifest good hysteresis, even the 2-volt loop. As ferroelectric memory ICs are extended to capacities of 256 Mb and beyond, operation at lower voltages becomes highly desirable.

Experiment 2

Figure 4:
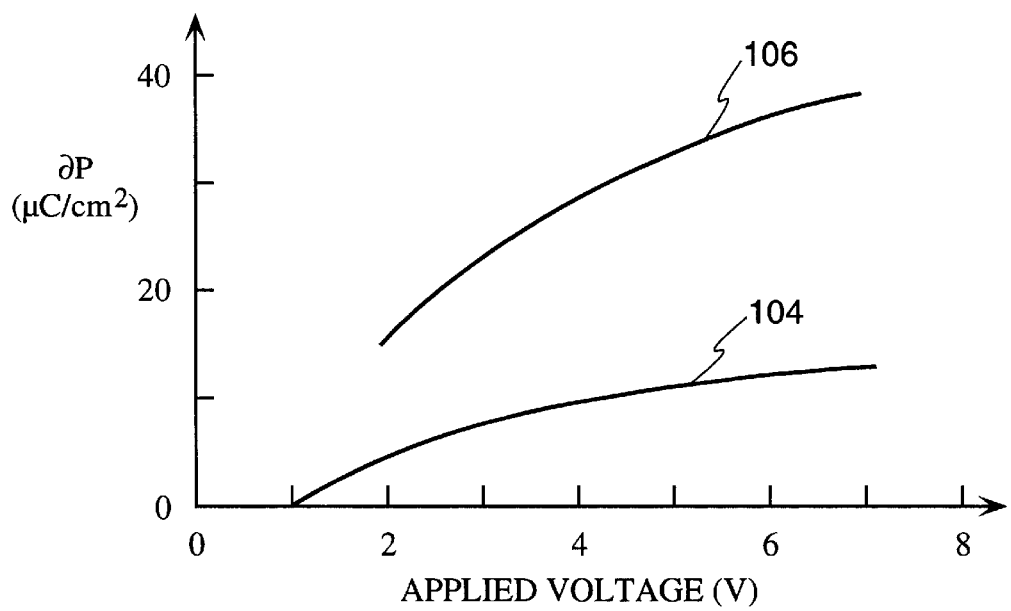
FIG 4 is a graph comparing the remanent poison of a ferroelectric capacitor with and without annealing of the invention.

Two chips were prepared with the intermetallic layer 76 being composed of $AlTi_3$ with 5 wt % doping of Nb. They were grown at room temperature. A comparative chip was fabricated without the rapid thermal anneal. Its polarization characteristic, as measured by the difference between switched and unswitched polarization, is plotted as a function of applied voltage in curve 104 in FIG. 4. The pulse width of the poling voltage was 2 ms. Another chip was subjected to rapid thermal annealing at 750° C. for 160 s after the growth of its lower LSCO layer 78. Its corresponding polarization characteristic is shown in curve 106. The chip that was annealed showed significantly better polarization, and its characteristics in the poling range of 2–3V were acceptable and even better than those of the unannealed chip at significantly higher poling voltages.

Experiment 3

Figure 5:
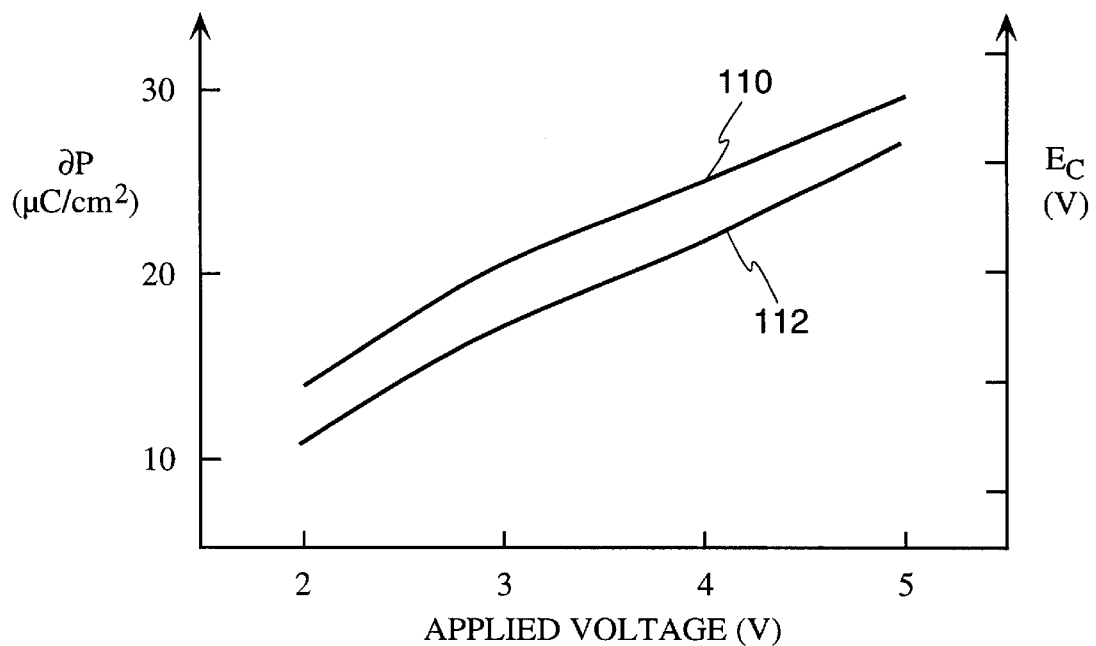
FIG. 5 is a graph showing polarization properties of a ferroelectric capacitor of the invention.

Another chip was grown at 600° C. with its intermetallic layer of $Ni_3Al$ and was subjected to rapid thermal annealing. Its remanent polarization ¶P and coercive voltage $E_c$ were measured as a function of the applied voltage. The remanent polarization is the difference between the switched and unswitched polarizations and the coercive voltage is the voltage value shown in the hysteresis loop with the polarization is zero. Curve 110 in FIG. 5 shows the remanent polarization; curve 112 shows the coercive voltage. The curves show that capacitors grown by this technique have sufficient (remanent) polarization ¶P at coercive voltages $E_c$ of one volt or less for an applied voltage of 3V, a desirable operating range for ULSI memories. As was shown by the data of FIG. 4, an unannealed capacitor does not afford such high polarization values.

Figure 6:
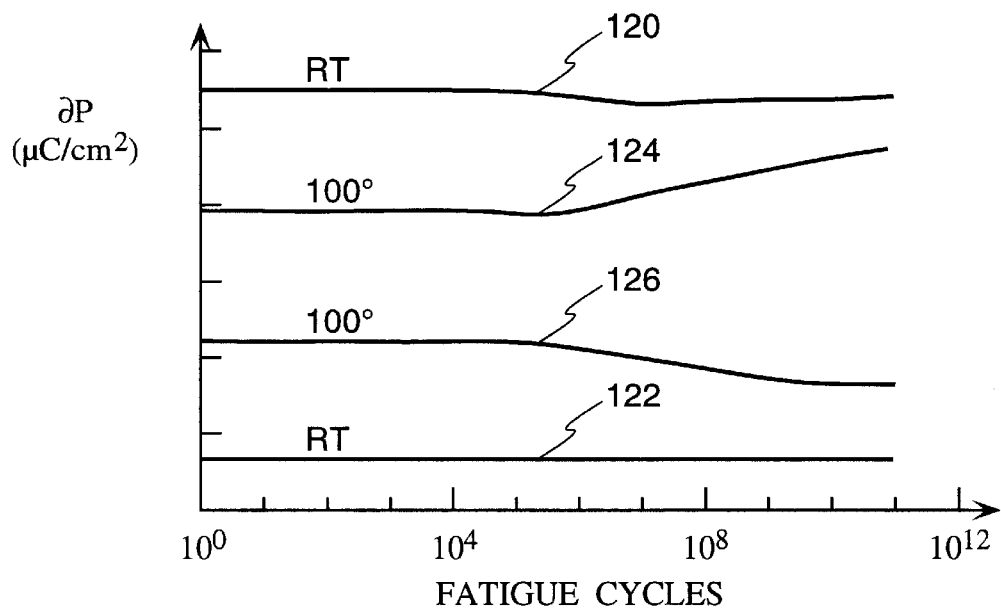
FIG. 6 is a graph of the fatigue characteristics at two different temperatures for ferroelectric capacitors of the invention.

The capacitors of the data of FIG. 5 were tested for fatigue by applying a bipolar square pulse of ±5V at 1 MHz. Curves 120, 122 of FIG. 6 show the remanent polarization ¶P. as a function of the number of fatigue cycles while the sample was held at room temperature. Curves 124, 126 similarly show the remanent polarization ¶P while the sample was held at 100° C. during the fatiguing cycles. It is believed that the improvement in the remanent polarization ¶P after fatiguing at 100° C. arises from an effective self-annealing during cycling at elevated temperatures. It is noted that the $10^9$ cycles at which the improvement is nearly complete at 100° C. corresponds to a self-annealing time of 17 minutes but that the self-annealing was performed after the complete ferroelectric stack had been grown.

Experiment 4

Figure 7:
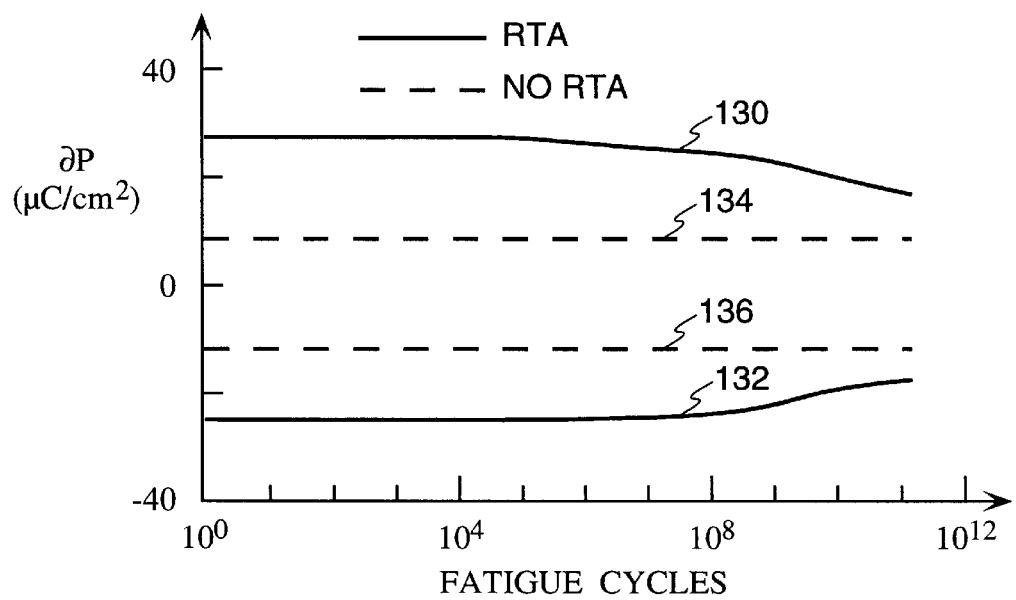
FIG. 7 is a graph of the fatigue characteristics of ferroelectric capacitors with and without the annealing of the invention.

Both an inventive and a comparative sample were grown at 600° C. with an intermetallic layer of $AlTi_3$ plus Nb dopants. Fatiguing tests at room temperature were performed on the resultant capacitors. Curves 130, 132 of FIG. 7 show the remanent polarization ¶P when rapid thermal annealing of the bottom LSCO layer was performed at 750° C. for 160 s while curves 134, 136 show the remanent polarization ¶P when no rapid thermal annealing as described above was performed. Although the polarization for the annealed sample does fall off above about $10^9$ cycles, it still remains above the polarization for the unannealed sample.

Experiment 5

Retention time was determined on a sample with an interrnetallic layer of $Ni_3Al$ and which was subjected to rapid thermal annealing. The remanent polarization was measured as a function of time over a period of about a day. The polarization decreased approximately with the logarithm of the time. If this dependence is assumed to extend to a polarization of 2 $mC/cm^2$, the retention time at room temperature is about 160,000 years and that at 100° C. is about 8000 years. These retention times are considered quite adequate.

Experiment 6

Figure 8:
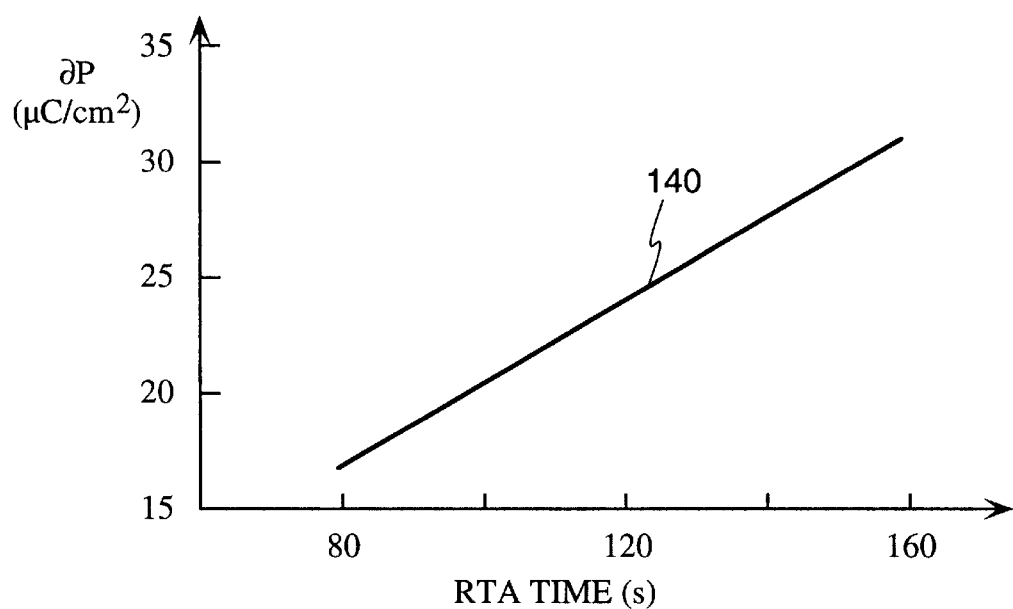
FIG. 8 is a graph of the dependence of remanent polarization upon the amount of annealing of the invention.

Several tests were performed to determine the effect of different amounts of rapid thermal annealing. A first set of samples were grown with an intermetallic layer of $AlTi_3$ with Nb doping. The lower LSCO layer was deposited at room temperature so that it was amorphous or polycrystalline. The samples were then subjected to rapid thermal annealing at 750° C. for times between 80 and 160 seconds. The capacitor fabrication was thereafter completed, and the remanent polarization ¶P was measured on each sample. The results generally follow plot 140 in FIG. 8. The initial conclusion is that more annealing is beneficial. However, it is believed that excessive annealing will eventually affect the internetallic layer and cause reliability problems. It is generally accepted that the thermal budget should be minimized consistent with other requirements. That is, the annealing time and temperature should be limited to values required for operational parameters.

Figure 9:
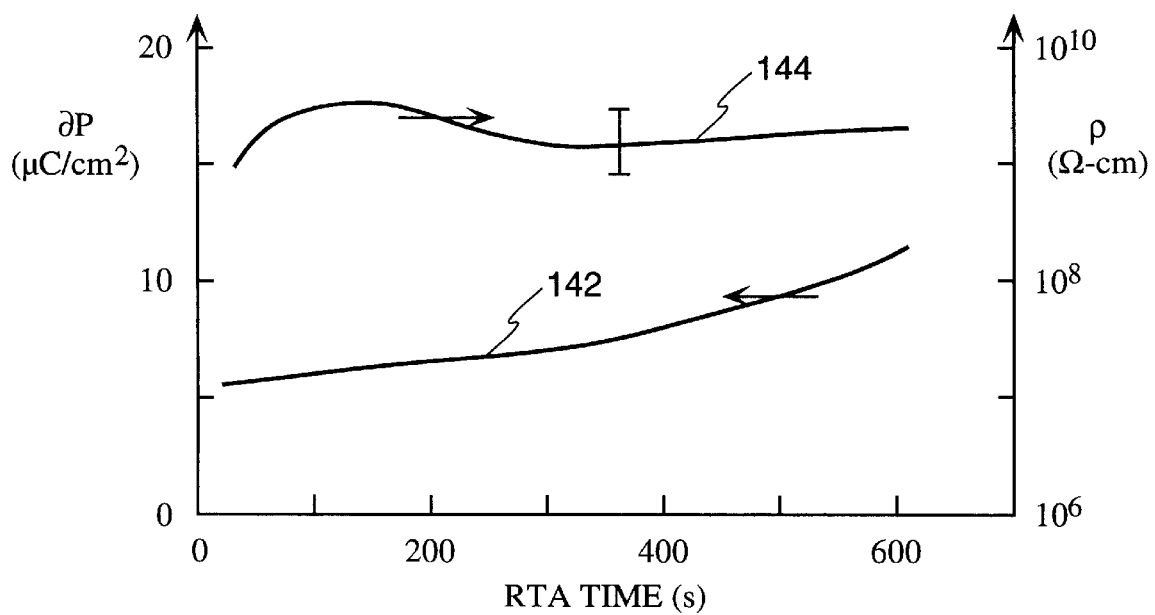
FIG. 9 is a graph of the dependences of remanent polarization and surface resistivity upon the amount of annealing of the invention.

A second set of samples were grown with an intermetallic layer of $Ni_3Al$. After the growth of the amorphous lower LSCO layer, the samples were subjected to different amounts of rapid thermal annealing at 750° C. After completion of the capacitor structures, both the remanent polarization and the resistivity were measured. The resistivity was measured with a two-point probe method using one small contact 88 and the large contact 90 of the type illustrated in FIG. 2. The measured resistance was normalized to resistivity assuming a capacitor stack of 50 mm on a side and a ferroelectric thickness of 300 nm. The experimental results are shown in curve 142 of FIG. 9 for the remanent polarization ¶P and in curve 144 for the resistivity. Similarly to the results of FIG. 8, prolonged rapid thermal annealing increases the polarization. For lesser amounts of annealing, the lower LSCO layer remained cxystalliographically unoriented producing a disordered ferroelctric layer. The resistivity is nearly constant and confirms that the thickness of the ferroelectric layer did not significantly vary between the samples.

The upper bounds of thermal annealing are not easily quantifiable and will need to be optimized in an overall process. Rapid thermal annealing of crystalline layers for more than 5 minutes defeats the purpose of RTA. However, an amorphous LSCO layer could benefit from a long anneal, about 15 minutes, in an oxygen-rich environment.

Experiment 7

Figure 10:
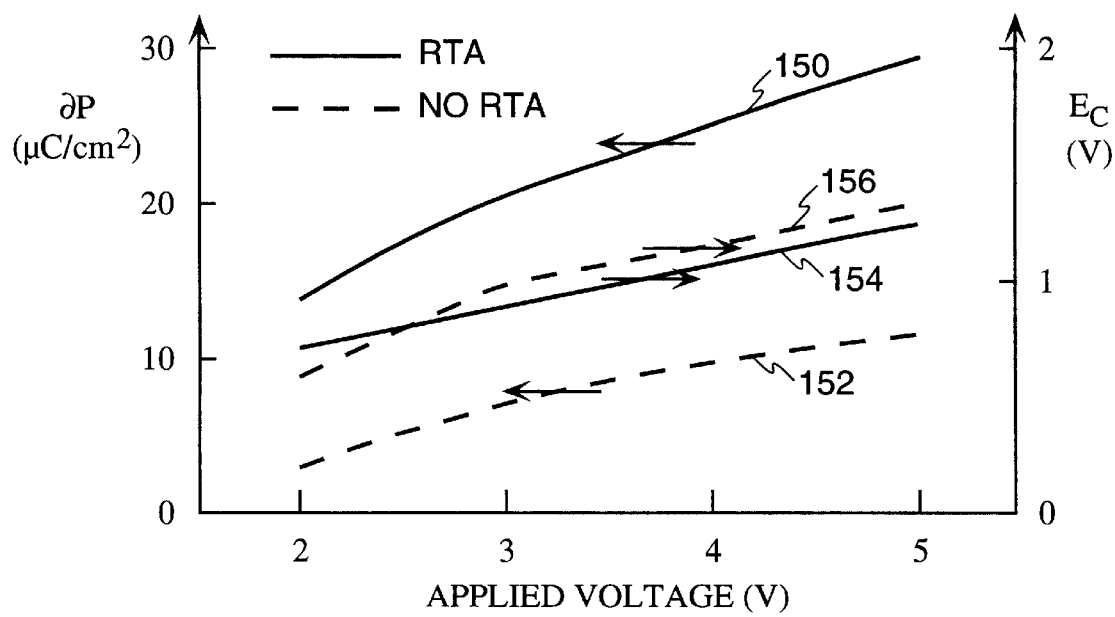
FIG. 10 is a graph of polarization properties of ferroelectric capacitors lacking a titanium nitride barrier and alternately being annealed and not annealed.

In our prior patent, we have suggested that a TiN barrier layer is not required to separate the intermetallic barrier layer from the underlying silicon. Samples were grown to confirm this result, both with and without rapid thermal annealing. Referring to FIG. 2, the intermetallic layer 76 of $Ni_3Al$ was grown directly on the polysilicon layer 72. The annealing, if performed, was for 120 s at 750° C. Curve 150 in FIG. 10 shows the measured remanent polarization ¶P as a function of the applied voltage when the sample was subject to rapid thermal annealing while curve 152 shows the corresponding values without annealing. Curves 154, 156 show the measured coercive voltage $E_c$ as a function of the applied voltage for the annealed and unannealed samples respectively. In comparison with the data presented in FIG. 5 for a structure including the TiN barrier layer, it is seen from FIG. 10 that the absence of the TiN barrier has little effect upon the annealed sample. However, the rapid thermal annealing of the non-TiN samples significantly improves the polarization.

Figure 11:
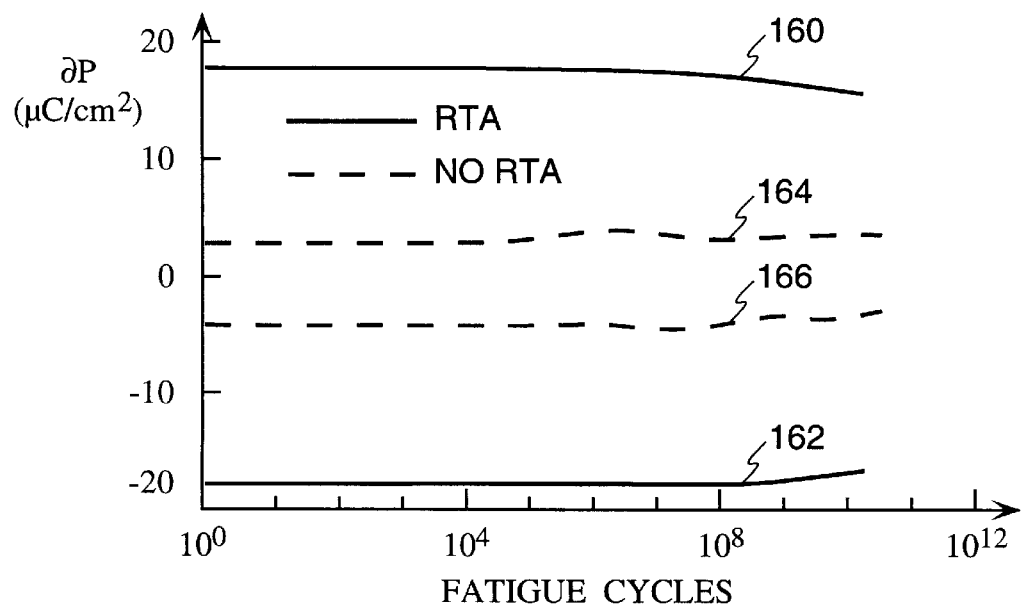
FIG. 11 is a graph of fatigue characteristics for the ferroelectric capacitors of FIG. 10.

Fatigue tests were also performed on these samples. Curves 160, 162 in FIG. 11 show the dependence of the remanent polarization upon the number of cycles at 100° C. for an annealed sample while curves 164, 166 show the corresponding dependence for an unannealed sample. Similar results are obtained for fatiguing at room temperature although then the unannealed sample is not so greatly inferior to the annealed sample. The results of FIG. 11 for no TiN barrier should be compared with those of FIG. 6 for a TiN barrier. All these results confirm that the intermetallic barrier eliminates the need for a TiN barrier.

The memory cell structure shown in FIG. 1 has some potential problems. Platinum is very porous to oxygen so that the upper platinum electrode 54 presents no barrier to oxygen diffusing upwardly from the upper metal-xide electrode 54 to the aluminum in the plug 60 or interconnect 62. Oxygen in sufficient amounts causes aluminum to ball up, introducing excessive contact resistance and greatly degrading the hysteresis characteristics observable from outside the ferroelectric stack. If the plug 60 is composed of aluminum, a TiN barrier may be deposited at the bottom of the contact hole before the aluminum deposition to prevent the oxygen diffusion. However, TiN does not adhere well to platinum so an intermediate glue layer of TiW may be required. The result is a complex fabrication process. Alternatively, the entire plug 60 may be composed of TiW, but deposition of thick layers of TiW is not widely practiced in silicon processing. Furthermore, the platinum is difficult to etch, particularly in a production-worthy process.

Figure 12:
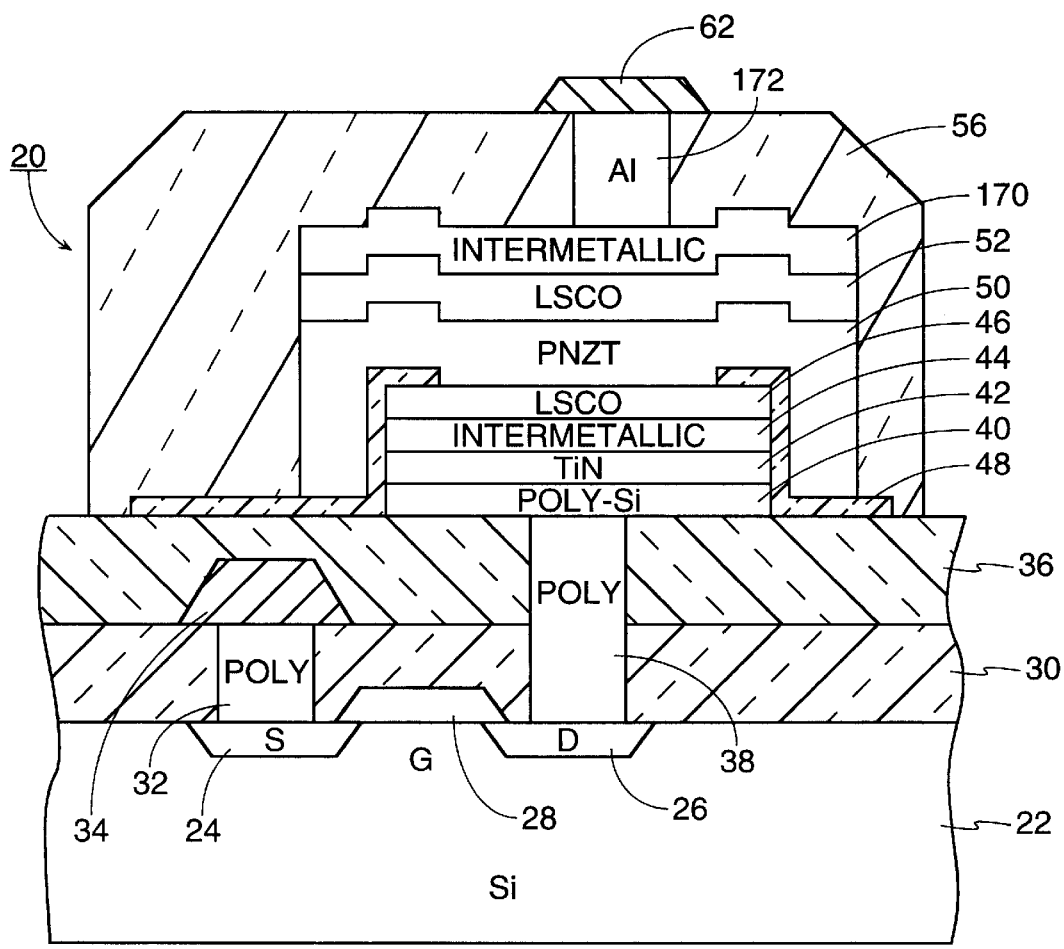
FIG. 12 is a cross-sectional view of an alternative emibodiment of the memory cell of the invention having an intermetallic upper contact layer.

According to another aspect of the invention, the upper platinum layer 54 of FIG. 2 is replaced, as illustrated in FIG. 12, by an upper intermetallic layer 170 directly overlying the upper metal-oxide layer 52. The upper intermetallic layer 170 acts as a barrier preventing the upwards migration of oxygen from the metal-oxide layer 52 to the overlying aluminum. Advantageously, the upper intermetallic layer 170 is composed of an aluminide intermetallic, such as $AlTi_3$, $Ni_3Al$, or NiAl. Then the via hole can be filled with a plug 172 of aluminum, which will bond well to the underlying aluminide intermetallic layer 170. The aluminide provides a good mechanical and ohmic interface between aluminum and the aluminide intermetallic. The use of non-aluminide intermetallics may necessitate a glue layer between the aluminum plug 172 and the intermetallic layer 170. As is well known in silicon processing, the aluminum of the plug 172 and of the interconnect 62 can be deposited in one step. Alternatively, an intermetallic can be filled into the plug 172 and even used as the interconnect 62. With a change in the geometry of the structure, it is possible to deposit the plug material directly onto the upper metal-xide layer 52.

Experiment 8

Figure 13:
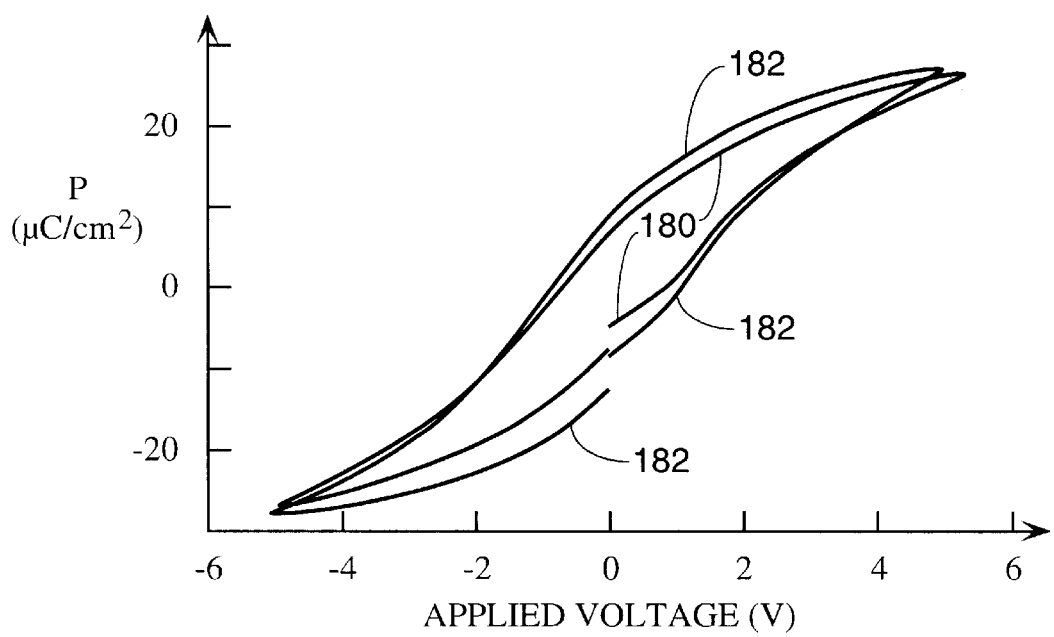
FIG. 13 is a graph of the hysteresis curves for two cells alternatively using an intermetallic and a platinum upper contact layer.

A prototype sample following the structure of FIG. 2 was grown with the contact layer 170 composed of $AlTi_3$. The lower intermetallic layer was sputter deposited, rather than by pulsed laser dposition, but the upper intermetallic layer was laser deposited. No rapid thermal processing was performed. As shown in the graph of FIG. 13, the room temperature hysteresis curve 180 for the upper intermetallic contact should be compared with the corresponding hysteresis curve 182 for an upper platinum contact. This process has not been optimized, and improvements are expected.

The experience of sputtering the intermetallic layer demonstrated that sputtering has a wider process window for the deposition than does pulse laser deposition. It is believed that the intermetallic more easily forms in stoichiometric ratios with sputtering, and sputtering is a proven production tool in the semiconductor industry.

The embodiments described above used NiAl, $Ni_3Al$, and $AlTi_3$ as the intermetallic material. However, a wide range of intermetallic compounds can be used for the barrier material. Other specific examples of intermetallics are NiTi and CoAl. A general family is represented by the compositions AB, $AB_2$, $AB_3$, $A_2B$, and $A_3B$, where A includes Fe, Cr, Co, Ni, Mn, Mo, and W and where B includes Al, Ti, Cr, Si, Ru, Re. Furthermore, intermetallic compounds include AA' and BB' alloys. Reference is made to the latter referenced patent application to Dhote and Ramesh for a fuller explanation.

Figure 14:
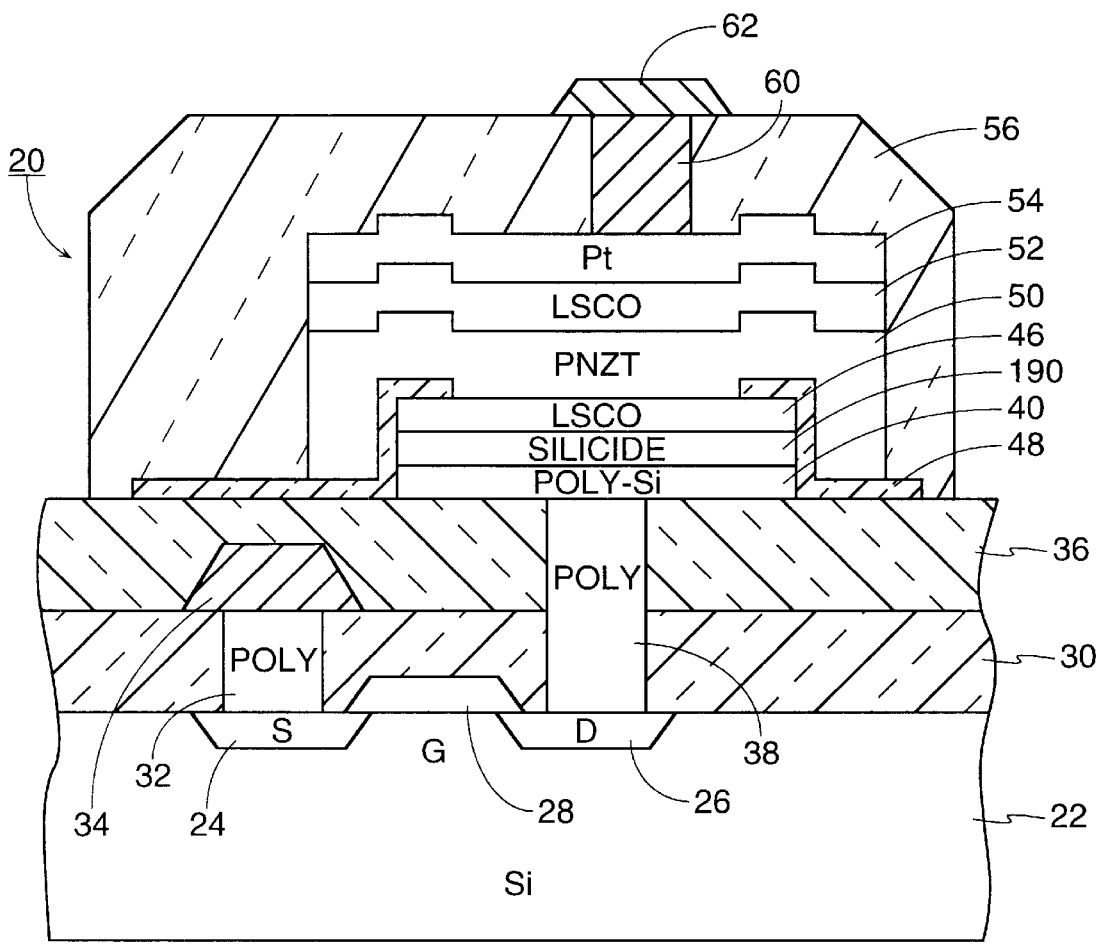
FIG. 14 is a cross-sectional view of a ferroelectric memory cell utilizing a silicide barrier.

A particularly promising set of materials for the intermetallic barrier are the silicide intermetallics, particularly intermetallic disilicides such as $MoSi_2$ and $WSi_2$ composed of disilicide bf a refractory metal. An exemplary structure is shown in the cross-sectional view of FIG. 14, which is a modification to the embodiment of FIG. 1. However, this embodiment lacks a TiN barrier layer, and a silicide layer 190 directly overlies the polysilicon layer 40. Such a silicide barrier can be combined with the upper intermetallic barrier 170 of FIG. 12, with that intermetallic being either a silicide or a different intermetallic.

Silicon-based intermetallics (silicides) have been used in silicon processing, particularly at boundaries between underlying silicon and overlying metals. A silicide is in general an alloy of a refractory metal and silicon, but better performance is obtained with stoichiometric or nearly stoichiometric compounds, particularly refractory metal disilicides. Examples of such silicides used in silicon processing are the disilicides $CoSi_2$, $TiSi_2$, $TaSi_2$, and $WSi_2$. Particularly in the embodiments without the TiN barrier layers, the silicide intermetallics offer a reliable interface with the immediately underlying silicon. In silicon processing, silicides can be deposited by chemical vapor deposition (CVD), which produces a very conformal coating, even in deep and narrow holes. Alternatively, the disilicide layer may be formed by sputtering a layer of the refractory metal onto silicon and then performing a rapid thermal anneal or a laser anneal. In practice, the rapid thermal annealing is performed in two steps, a lower-temperature anneal to produce the monosilicide and a higher-temperature anneal to convert the monosilicide to the disilicide. The monosilicide may be selectively etched more easily than the disilicide. The two annealing temperatures for $CoSi_2$ are approximately 450° and 700° C., and for $TiSi_2$ are 680° and 750° C., temperatures consistent with the previously described steps. The laser annealing can be advantageously applied to forming the upper metallic layer by programming the laser positioning.

The above described process of annealing a refractory metal and silicon into an intermetallic silicide suggests that the rapid thermal annealing of the lower part of the ferroelectric cell may be fundamentally affecting the laser ablated intermetallic layer. Shindo et al. have disclosed in U.S. Pat. No. 5,449,933 that an aluminum-rich NiAl or NiCrAl alloy can transmit crystallographic orientation from a templating layer to a perovskite layer. Although these alloys are not intermetallic alloys, they are formed of constituents which do form intermetallics.

Experiment 9

Figure 15:
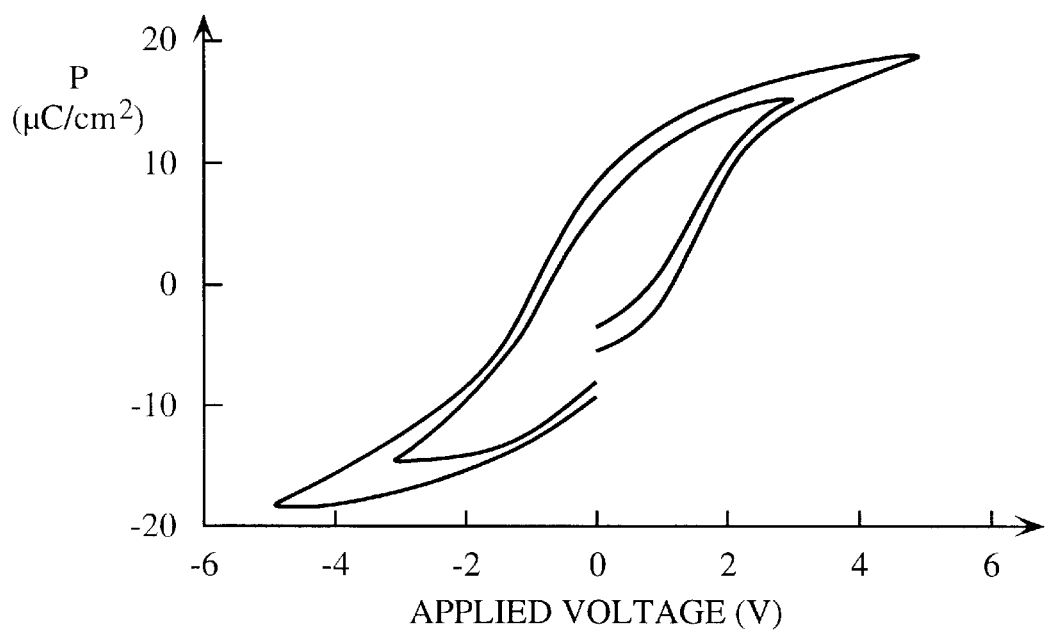
FIG. 15 is a graph showing two hysteresis curves for a test structure with a silicide barrier.

Two prototype test chips were fabricated using alternatively $MoSi_2$ or $WSi_2$ as the silicide layer deposited by pulse laser deposition. The test structure lacked the TiN layer 74 of FIG. 2 with the silicide layer 76 formed directly on the polysilicon layer 72. and no rapid thermal annealing was performed. The hysteresis loop for the $MoSi_2$ is shown in FIG. 15 for both a 5V loop and a 3V loop. Fatigue and retention tests were also performed. These results generally show lifetimes similar to those described above for barriers of non-silicon intermetallics, but the polarization levels are substantially lower for silicide barriers. The results for $WSi_2$ were similar to those for $MoSi_2$.

Although the invention has been motivated by the desire for better ferroelectric memory cells, it is not so limited and may be extended to a number of other applications. Similar device geometries are used for membrane switches in piezoelectric electro-micromechanical systems, and for uncooled infrared detetors using lead titanate, lead tantalate, or similar materials. For as intermetallic barrier layer of NiTi, which is also a shape memory alloy, a fernoelectric layer integrated on the memory alloy can be used to control the phase transformation of the layer.

A ferroelectric cell has many similarities to a high-temperature superconductive junction structure since these superconductors have a perovskite crystal similar to many of the ferroelectrics, and indeed many perovskite superconductors exhibit ferroelectric behavior. High-quality crystallographically oriented perovskite thin films can be grown on metal-oxide templating layers such as LSCO, bismuth titanate (BTO), and praeseodymium barium copper oxide (PrBCO). Many of these templating materials are layered perovskites rather than the cubic perovskite of LSCO. Perovskites have a number of useful electrical characteristics that can be utilized in useful devices, which become more useful if they can be integrated onto silicon. The intermetallic barrier layer of the invention allows such templating layers, often additionally used as electrodes, to be grown over silicon and other semiconductors.

Although the above described embodiments have included a perovskite layer sandwiched between two conductive (electrode) metal-oxide layers, other devices have been described having electrodes only at the bottom of a perovskite layer. Examples of such devices include magnetoresistive devices, such as spin valves.

The invention thus provides a simple and inexpensive method of improving the performance of perosvkite cells acting as electronic devices.

The invention also provides several novel compositions and structures for the intermetallic layer around the perovskite cell.

The various aspects of the invention provide a commercially manufacturable, reliable perovskite cell, especially a ferroelectric memory cell. Nonetheless, the changes required over the prior art of minor and are obtainable at low cost.

What is claimed is:

1. A method of fabricating a perovskite cell, comprising the steps of:

a first step of depositing a metal-oxide layer comprising crystallites upon a substrate at a first temperature in an oxygen-rich environment;

then rapid thermal annealing said substrate at a second temperature higher than said first temperature for an annealing time of no more than 160 seconds, wherein said second temperature is second temperature is sufficiently high and said annealing time is sufficiently long to crystallographically orient said metal-oxide layer; and a subsequent second step of depositing a perovskite layer comprising a perovskite material upon said metal-oxide layer.

2. The method of claim 1, wherein said second temperature is at least 750° C.

3. The method of claim 1, wherein said metal-oxide layer comprises a perovskite material.

4. A method of fabricating a perovskite cell, comprising the steps of:

a first step of depositing a metal-oxide layer comprising crystallites of a first perovskite material upon a substrate at a first temperature;

then rapid thermal annealing said substrate at a second temperature higher than said first temperature and for an annealing time of no more than 160 seconds; and a second step of depositing a perovskite layer comprising a second perovskite material upon said metal-oxide layer.

5. The method of claim 4, wherein said second perovskite material is ferroelectric.

6. The method of claim 4, wherein second depositing step is performed after said annealing step.

7. The method of claim 4, wherein said substrate comprises a semiconductor material and further including a third step, performed before said first step, of forming an intermetallic layer over said substrate.

8. The method of claim 7, wherein said third step includes:

depositing over said substrate a metal layer comprising a metal of which said intermetallic layer is comprised; and heat treating said metal layer to form said intermetallic layer from said metal layer and said substrate.

9. The method of claim 8, wherein said second perovskite material is a ferroelectric and wherein said metal-oxide layer is electrically conductive to form a lower electrode to said perovskite layer and further comprising a third step of depositing a conductive layer over said perovskite layer to form an upper electrode to said perovskite layer.

10. The method of claim 9, wherein said second depositing step is performed after said annealing step.

11. The method of claim 10, wherein said annealing step is performed after said second depositing step and before said third depositing step.

12. The method of claim 10, wherein said annealing step is performed after said third depositing step.

13. The method of claim 10, wherein said conductive layer formed over said perovskite layer comprises an intermetallic.

14. The method of claim 10, wherein said semiconductor material comprises silicon and wherein said intermetallic layer comprises a silicide of a refractory metal.

15. The method of claim 14, wherein said silicide comprises a disilicide of said refractory metal.

16. The method of claim 14, wherein said intermetallic layer is formed directly over said silicon.

17. The method of claim 16, wherein said third step of forming said intermetallic layer comprises depositing a metal layer comprising said refractory metal on said silicon and then annealing said metal layer and at least a surface of said silicon, whereby said silicide is formed by a reaction between said refractory metal and said silicon.

18. The method of claim 17, wherein said silicide comprises a disilicide of said refractory metal.

19. The method of claim 4, wherein said first perovskite material comprises lanthanum, strontium, cobalt and oxygen.

20. The method of claim 4, wherein said second temperature is at least 750° C.

* * * * *